United States Patent
Heise

(10) Patent No.: US 8,351,537 B2
(45) Date of Patent: Jan. 8, 2013

(54) SEAMLESS CHANGE OF DEPTH OF A GENERAL CONVOLUTIONAL INTERLEAVER DURING TRANSMISSION WITHOUT LOSS OF DATA

(75) Inventor: Bernd Heise, Munich (DE)

(73) Assignee: Infineon Technologies AG, Neubiberg (DE)

( * ) Notice: Subject to any disclaimer, the term of this patent is extended or adjusted under 35 U.S.C. 154(b) by 793 days.

(21) Appl. No.: 12/411,228

(22) Filed: Mar. 25, 2009

(65) Prior Publication Data

US 2009/0185605 A1 Jul. 23, 2009

Related U.S. Application Data

(63) Continuation of application No. 11/274,952, filed on Nov. 15, 2005, now Pat. No. 7,529,984.

(60) Provisional application No. 60/628,257, filed on Nov. 16, 2004, provisional application No. 60/655,518, filed on Feb. 23, 2005.

(51) Int. Cl.
    *H04L 27/00* (2006.01)
(52) U.S. Cl. ......................... 375/295; 714/701
(58) Field of Classification Search .................. 375/295, 375/296; 714/701
    See application file for complete search history.

(56) References Cited

U.S. PATENT DOCUMENTS

| 4,901,319 | A | 2/1990 | Ross |
| 5,764,649 | A | 6/1998 | Tong |
| 5,912,898 | A | 6/1999 | Khoury et al. |
| 6,151,690 | A | 11/2000 | Peeters |
| 6,411,654 | B1 | 6/2002 | Furutani et al. |
| 6,421,796 | B1 * | 7/2002 | Gatherer ....................... 714/702 |
| 6,536,001 | B1 | 3/2003 | Cai et al. |
| 6,546,557 | B1 | 4/2003 | Ovadia |
| 7,200,794 | B2 | 4/2007 | Starr |
| 2002/0016938 | A1 | 2/2002 | Starr et al. |
| 2003/0021338 | A1 | 1/2003 | Mazzoni et al. |
| 2003/0070138 | A1 * | 4/2003 | Chow ........................... 714/796 |

FOREIGN PATENT DOCUMENTS

| EP | 0856949 A | 8/1998 |
| EP | 856949 A1 * | 8/1998 |
| EP | 1098466 A | 5/2001 |
| GB | 2 332 836 A | 6/1999 |
| GB | 2332836 A | 6/1999 |
| WO | 9637050 A | 11/1996 |

OTHER PUBLICATIONS

"A Dynamic Interleaving Scheme for VDSL", Miguel Peters, Paul Spruyt and F. Wellesplein, Alcatel Telecom, Austin, Feb. 3-7, 1997, 8 pgs.
International Search Report dated Jun. 29, 2006 issued to Application No. PCT/EP2005/012298.
Series G: Transmission Systems and Media, Digital Systems and Networks, International Telecommunication Union, G.993.1 dated Jun. 2004, p. 1-3.

* cited by examiner

*Primary Examiner* — Sam K Ahn
*Assistant Examiner* — Freshten N Aghdam
(74) *Attorney, Agent, or Firm* — Eschweiler & Associates, LLC

(57) ABSTRACT

Methods and communication systems are presented, in which impulse noise is monitored on a communication channel, and an interleaver depth is adjusted according to the monitored impulse noise without interrupting communication service.

10 Claims, 8 Drawing Sheets

SEAMLESS CHANGE OF DEPTH OF A GENERAL CONVOLUTIONAL INTERLEAVER DURING TRANSMISSION WITHOUT LOSS OF DATA

RELATED APPLICATIONS

This application claims priority to U.S. Provisional Application Ser. Nos. 60/628,257, filed Nov. 16, 2004, entitled "SEAMLESS CHANGE OF DEPTH OF A GENERAL CONVOLUTIONAL INTERLEAVER DURING TRANSMISSION WITHOUT LOSS OF DATA", 60/655,518, filed Feb. 23, 2005, entitled "SEAMLESS CHANGE OF DEPTH OF A GENERAL CONVOLUTIONAL INTERLEAVER DURING TRANSMISSION WITHOUT LOSS OF DATA" and is a Continuation of Ser. No. 11/274,962, filed Nov. 15, 2005, entitled SEAMLESS CHANGE OF DEPTH OF A GENERAL CONVOLUTIONAL INTERLEAVER DURING TRANSMISSION WITHOUT LOSS OF DATA.

FIELD OF INVENTION

The present invention relates generally to communication systems and more particularly to adaptive communication methods using Digital Subscriber Line (DSL).

BACKGROUND OF THE INVENTION

Digital subscriber line (DSL) technology provides high-speed data transfer between two modems across ordinary telephone lines, wherein digital data transfer rates from tens of Kbps to tens of Mbps are supported over standard (e.g., twisted pair) telephone lines, while still providing for plain old telephone service (POTS). Asynchronous Digital Subscriber Line (ADSL) and Very High Digital Subscriber Line (VDSL) have emerged as popular implementations of DSL systems, where ADSL is defined by American National Standard Institute (ANSI) standard T1.413 and International Telecommunication Union (ITU-T) standards G.992.3, G.992.5, and VDSL is defined by ANSI standard T1.424 and ITU-T standard G.993.1. ADSL, VDSL and other similar DSL systems (collectively referred to as "xDSL") typically provide digital data transfer in a frequency range above the POTS band (e.g., about 300 Hz to 4 kHz), for example ADSL G.992.3 operates at frequencies from about 25 kHz to about 1.1 MHz.

Most DSL installations are operated as multicarrier systems using Discrete Multi Tone (DMT) modulation, in which data is transmitted by a plurality of subcarriers (tones), sometimes alternatively referred to as subchannels, sub-bands, carriers, or bins, with each individual subcarrier utilizing a predefined portion of the prescribed frequency range. In ADSL, for example, 256 subcarriers are used to transmit a DMT symbol, with each subcarrier having a bandwidth of 4.3125 kHz. The transmit digital data is encoded and modulated at the transmitter using Quadrature Amplitude Modulation (QAM) and Inverse Discrete Fourier Transform (IDFT) to create the modulated multicarrier signal for transmission along the DSL loop or channel, which is then demodulated at the receiving end and decoded to recover the transmitted data. The bits of data to be transmitted over each subcarrier are encoded as signal points in QAM signal constellations using an encoder or a bit mapping system. Signal constellations are then modulated onto the corresponding subcarrier. The total number of data bits transmitted over the channel is a sum of the bits transmitted by each subcarrier.

As in most types of communication systems, it is desirable to maximize the amount of data successfully transferred across the communication medium between DSL modems, sometimes referred to as the bit rate or data rate. The data rate, in turn, depends on the noise characteristics of a particular communication channel. In the case of DSL systems, a pair of modems is connected by a twisted pair of wires (sometimes referred to as a loop) that form the communication medium. In this situation, noise may be generated by signals on neighboring wire pairs (e.g., crosstalk noise) in a distributed telephony system, as well as by outside sources of Radio Frequency Interference (RFI) or other noise. The noise on a particular communication channel may be generally modeled or characterized as continuous noise or impulse noise or both. Continuous noise is sometimes modeled as Additive Gaussian Noise (AGN) with randomly distributed values of noise over time, whereas impulse noise is generally short bursts of relatively high levels of channel noise. Various mechanisms or techniques are employed in DSL and other communication systems to combat continuous and impulse noise and/or to correct noise-related data transfer errors.

Continuous noise is typically addressed by transmitting more data bits over subcarriers with small amounts of continuous noise, and fewer data bits over subcarriers with higher continuous noise. The allocation of data bits to particular subcarriers is sometimes referred to as bit allocation or bit distribution, wherein the bit distribution parameters may be set to accommodate particular continuous noise conditions on the channel. However, simply maximizing continuous noise protection by reducing the number of bits transmitted by specific sub-carriers may lead to non-optimal system data rate, since maximizing continuous noise protection in this way reduces the number of data bits on the subcarriers. Accordingly, DSL systems are initially setup with continuous noise protection (e.g., bit distribution) settings or parameters that are selected according to subcarrier noise assessments based on estimation of the channel noise during system initialization. While such approaches using fixed continuous noise protection settings provide a good continuous noise protection and high data transfer rates, communication channel continuous noise conditions tend to change over time. In this regard, if the continuous noise decreases, the fixed modulation parameters will suffice to protect against data errors, but potential increased data rates are not attained. Conversely, if the continuous noise increases, the previously set protection parameters may no longer be sufficient to provide adequate protection against data transfer errors in the channel.

In order to address this situation, DSL systems provide adaptive tuning of the bit distribution parameter settings to accommodate changing of continuous noise, including bit swapping, rate adaptation, and bandwidth repartitioning techniques, each of which involve changes to a number of modulation parameters. In a typical situation, the signal-to-noise ratio (SNR) for each subcarrier is measured during system initialization, and the maximum bit capacity of each subcarrier is determined. Once the transmission capability of the system is thus assessed, more bits (e.g., larger constellation sizes) are assigned onto subcarriers with higher SNR compared to subcarriers having lower SNR and the subcarrier relative transmit powers (gains) are set. DSL service is then begun and the subcarriers SNR are measured during data transmission; the bit re-distribution (bit swapping) being performed and subcarrier gains being adjusted according to changes in the subcarrier SNR measurements.

Bit swapping by itself does not change the total data rate of the communication channel, but serves to increase or maintain continuous noise immunity by reallocating data bits from noisy subcarriers to more noise-free subcarriers. Where the channel noise increases significantly, bit swapping alone may not be adequate to prevent data transmission errors, and seamless rate adaptation (SRA) may be employed to decrease the number of data bits transmitted over some subcarriers. If the channel continuous noise thereafter decreases (e.g., SNR increases), SRA can then be used to increase the number of data bits. While these techniques can effectively react to changing continuous noise conditions, impulse noise protection is largely unaffected by bit distribution settings and seamless rate adaptation.

Impulse noise in DSL systems usually causes erasure of an entire modulated signal for a relatively short period of time, regardless of the number of bits allocated to the entire channel or to particular subcarriers. Forward error correction (FEC) is a means to combat impulse noise in DSL and other communication systems. An FEC encoder generates a certain amount of redundancy bytes for each block of transmitted data bytes. The redundancy bytes are then added to the data bytes to form an FEC codeword. At the receive side, the FEC decoder uses redundancy bytes for recovering (correcting) a certain amount of corrupted data bytes, and thereby ensures that when a small number of bytes in a codeword are corrupted, the original data transmitted in the codeword can be recovered. In general, the number of error bytes that can be corrected by FEC is half of the number of redundancy bytes included in the codeword. Thus, increasing FEC redundancy adds further FEC protection against impulse noise while effectively decreasing the data rate, and vice versa, wherein the goals of impulse noise protection and data rate involve a tradeoff.

In addition to redundancy, FEC encoders also provide interleaving (IL) to combat impulse noise. An interleaver (at the transmit side) segments the FEC codewords or blocks into smaller portions (segments) after the addition of FEC redundancy bytes, with segments from different codewords being mixed in a certain order prior to bit distribution and modulation. The order of segment mixing is so that segments belonging to the same FEC codeword are placed as far as possible from each other. This results in the bytes of the same codeword being spread out over time, whereby impulse noise corruption of the transmitted stream of data during any given short period of time results in corruption of only one or a few segments belonging to a particular codeword or block, causing fewer errors in each reassembled (e.g., de-interleaved) codeword at the receive side. Thus, FEC redundancy allows correction of a certain amount of corrupted data in each codeword, and interleaving helps to reduce the amount of corrupted bytes in the individual codewords, whereby DSL systems may effectively combat a given amount of impulse noise in the communication channel. However, interleaving requires buffer memory at the transmitter and receiver modems and introduces latency in the transferred data. Also, as discussed above, increasing FEC capabilities requires more redundancy bytes to be introduced, and reduces the data rate. Thus, there is a tradeoff between impulse noise protection and data rate in DSL systems.

The parameters for impulse noise protection mechanisms, such as FEC and interleaving in DSL systems, have conventionally been set up at system installation. For example, interleaver parameters may include the code word length (i.e., block size), the number of redundancy bytes, the block size, and the interleaver depth. These parameters are typically determined with the goal of protecting against individual byte errors and achieving a prescribed error protection length (which is defined as the number of sequential corrupted bytes that can be correctly recovered). However, impulse noise characteristics for any specific installation are generally changing in time. Consequently, at some later point in time, since the impulse noise characteristics may have changed, and the interleaver parameters have not changed, transmission errors may occur. Accordingly, it is desirable to alter the interleaver depth and/or data rate in order to optimize the interleaver with respect to error correction. In addition, a change in the data rate may impact the interleaver delay or result in a change in error protection, which may further necessitate a change in the interleaver parameters such as the interleaver depth to fulfill the requirements for the minimum error protection. Consequently, it is advantageous for the interleaver depth to be altered during operation of the DSL system.

One prior art solution proposed to adjust the interleaver depth is to shut down the data communication system entirely for a defined period of time during which new interleaver parameters based on the new impulse noise environment are generated. The system is then reactivated. This solution, however, has some disadvantages in that data communication is completely interrupted for several seconds. In certain applications, for example, video streaming or telephony, such a solution is unacceptable. Another solution has proposed supporting changes in the interleaver depth without an interruption in service, however, such changes require that minimum interleaver depth be an integer multiple of the block length of the data (code word length) being interleaved. In such instances, the granularity of the modifications is disadvantageously large, thereby severely hampering the ability to optimize the communication system. The prior art is based on an interleaver that is restricted to values of $D=M*I+1$. Changes occur only in that granularity. The effect is that changes of D lead to gaps in data transmission of "$I^2$". A usual value of I is for example 30, so a change in D by 1 will lead to a jump in delay of 900 Bytes. To hide these jumps outside the transceiver a continuous buffering has to be added that my lead to an additional (not desired) continuous latency.

Accordingly, there is a need for improved impulse noise protection methods and apparatus to combat changing impulse noise in transmission channels of DSL and other communication systems.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention involves communication systems and methods for adaptive adjustment of a DSL or other communication systems, in which impulse noise on a communication channel is monitored during the communication service, and impulse noise protection is selectively adjusted according to the impulse noise without interrupting the communication service. The invention facilitates tailoring impulse noise protection by adjusting a depth of a convolutional interleaver without a limit to the granularity of such changes. Accordingly, small or large modifications in the interleaver depth can be made without a loss of data.

One aspect of the invention provides a method for altering an interleaver depth, wherein a receiver identifies a change in system conditions that warrant an interleaver depth change.

The receiver ascertains an amount of change in the interleaver depth (either an increase or a decrease) and communicates that change to a transmitter over a management channel, for example. The transmitter then communicates synchronization information back to the receiver to indicate when the change in the interleaver depth is to occur, so that both the transmitter and receiver implement such changes at the same data point.

In response to an increase in interleaver depth, the transmitter increases a size of the transmit FIFOs associated therewith by moving the read pointers of the corresponding FIFOs, wherein each change in size corresponds to the interleaver depth change ΔD. While the initial size and order in which the transmitter FIFOs are read is a function of the initial interleaver depth $D_1$, the order in which the data is read from the transmitter FIFOs to the receiver FIFOs is then altered based on the depth change (to $D_2$), and data is then transferred in accordance with the new order. Dummy data associated with the pointer changes is read in accordance with the new order, but the receiver FIFOs discard the dummy data based on a control algorithm based on the depth change ΔD. After a predetermined time period, all subsequent data is accepted and saved in the receiver FIFOs in accordance with the new ordering. Concurrently, no new data is output from the receiver FIFOs until valid data from the largest transmitter FIFO has been received. During that time no data leaves the receiver FIFOs while valid data is input thereto, and thus the receiver FIFOs are increased in size according to the desired increase in interleaver depth ΔD.

In response to a decrease in the interleaver depth, the transmitter increases selected transmission FIFOs based on the depth change ΔD such that valid data will still be transferred from the largest transmission FIFO. Dummy data is defined in the remaining transmission FIFOs and data is transferred to the receiver FIFOs based on an altered transmission ordering that is a function of $D_1$ and $D_2$. Concurrently, no new data is input into the transmission FIFOs until valid data from the largest FIFO has been transmitted. Since data leaves the transmission FIFOs while no data is input thereto, the transmission FIFOs are decreased in size according to the desired decrease in interleaver depth ΔD. In the receiver FIFOs the received dummy bytes are discarded and only valid data is input to the FIFOs. Since data leaves the receiver FIFOs while less data is input thereto, the receiver FIFOs are decreased in size according to the desired decrease in interleaver depth ΔD.

In accordance with another embodiment of the present invention, a change in the interleaver depth is achieved by selectively inserting dummy bytes spread throughout the useful data as opposed to transferring dummy bytes in blocks. In the above manner, an interruption in data transfer at the output of the de-interleaver is substantially eliminated, thereby facilitating a change in interleaver depth without data interruption, which is advantageous in applications in which a system latency must be maintained generally constant.

In one aspect of the invention, a byte to be transferred from one of the transmission FIFOs to the loop is evaluated by ascertaining a distance in time between that particular byte and its preceding byte within its original interleaver data block (a byte that has already been transmitted). If the distance in time between the bytes exceeds a predetermined threshold (preferably a threshold that reflects a maintenance of the impulse noise protection (INP) specification), the byte is transmitted from the transmission FIFO to a receiver FIFO over the loop. Alternatively, if the distance in time between the bytes is less than the predetermined threshold, then a dummy byte is transmitted, which is interspersed with useful data, in order to maintain the distance in time between bytes for purposes of impulse noise protection.

The following description and annexed drawings set forth in detail certain illustrative aspects and implementations of the invention. These are indicative of only a few of the various ways in which the principles of the invention may be employed.

DETAILED DESCRIPTION OF THE INVENTION

Figure 1:
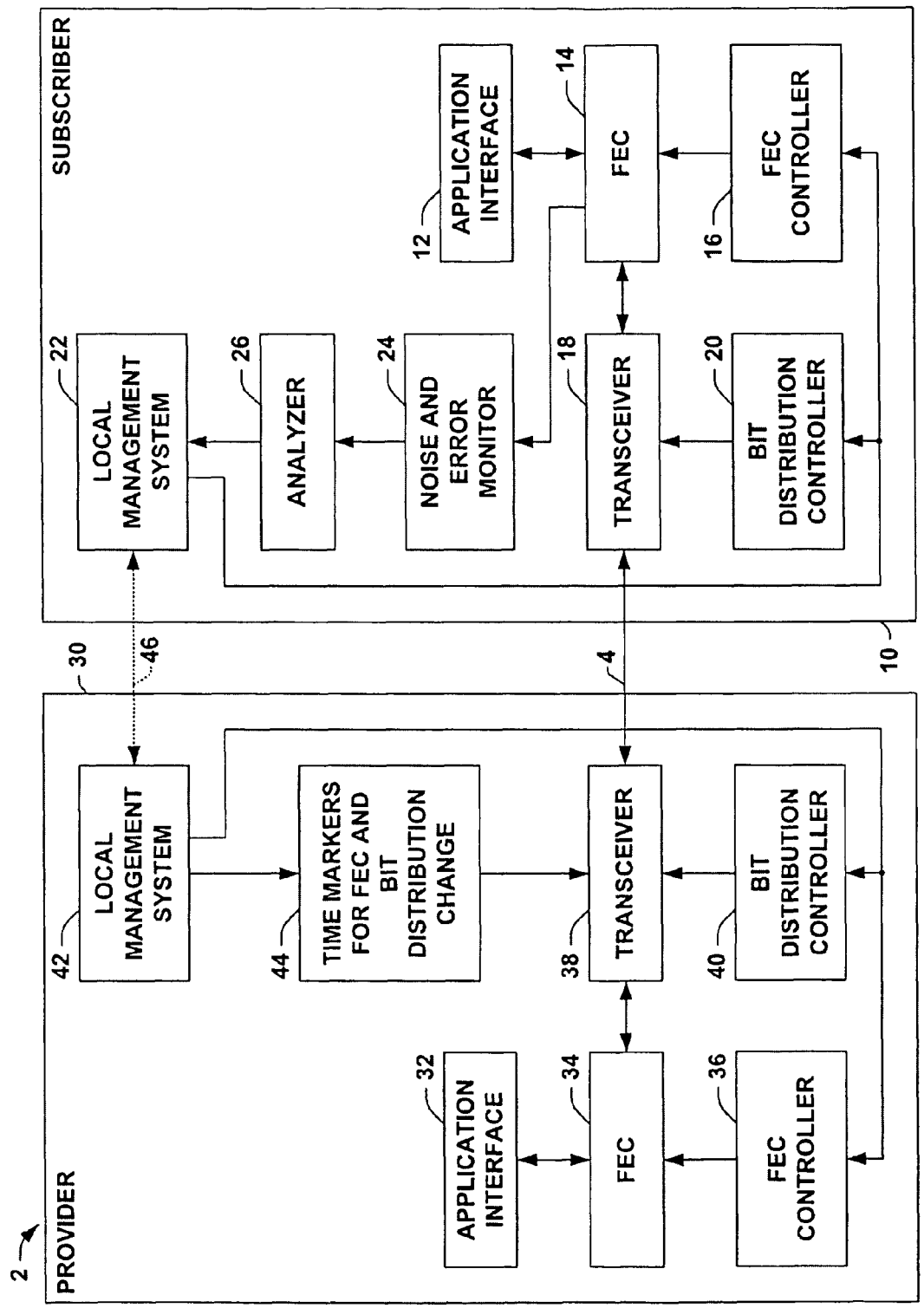
FIG. 1 is a schematic diagram illustrating an exemplary multicarrier DSL communication system with first and second DSL modems coupled with a communication channel or loop in accordance with one or more aspects of the present invention.

One or more implementations of the present invention will now be described with reference to the attached drawings, wherein like reference numerals are used to refer to like elements throughout. The invention relates to communication systems and methods for adaptive adjustment of system parameters to combat impulse noise, which is hereinafter illustrated in the context of an exemplary DSL multicarrier communication system using Discrete Multitone Transmission (DMT) modulation with interleaving (IL), and an interleaver depth adjustment for impulse noise protection. However, the invention finds utility in association with any type of communication systems, including but not limited to DSL systems, and single or multicarrier communication systems wherein any type of interleaving may be employed and dynamically adjusted according to impulse noise or other type conditions.

The invention involves monitoring impulse noise conditions and adjusting impulse noise protection parameters such as the interleaver depth during the provision of communication services. The invention may thus provide for adaptation of impulse noise protection for changing noise conditions.

FIG. 1 illustrates an exemplary multicarrier DSL communication system 2 in which one or more aspects of the invention may be implemented, comprising first and second DSL modems 10 and 30, respectively, coupled with a communication loop or channel 4. The exemplary communication channel 4 is a twisted pair or copper wires in a conventional residential telephone system, although the invention may be employed in communication systems employing any type of communication channel 4 by which data can be transferred between the modems 10 and 30. The exemplary modems 10 and 30 are DSL modems having suitable circuitry for providing DSL communication service on the channel 4 generally in accordance with ANSI T1.413 (ΔDSL), T1.424 (VDSL) and other DSL standards, including performance of the tasks and functions described herein.

In the illustrated system 2, the first modem 10 is a subscriber modem that may be located in a residential home, and the second modem 30 is located at a DSL service provider. Data is transferred in both directions along the channel 4, wherein the subscriber modem 10 transmits data to be received by the provider modem 30 and the provider modem 30 transmits data to be received by the subscriber modem 10. In this regard, the exemplary communication system 2 is symmetrical, although the various aspects of the invention may be carried out in other systems in which data is transferred in a single direction only. In order to appreciate the various aspects of the invention, the exemplary system 2 and the various methods of the invention are hereinafter described with respect to data being transferred in a first direction from the provider modem 30 to the subscriber modem 10. Accordingly, in the following discussion, the first modem 10 (specifically, a transceiver 18 thereof) may be referred to as a "receiver" and the second modem 30 (specifically, a transceiver 38 thereof) may be referred to as a "transmitter" for purposes of describing the various aspects of the invention, with the first (receiver) modem 10 monitoring and analyzing impulse noise and proposing noise protection parameter changes to the second (transmitter) modem 30, which then institutes the changes. However, it will be appreciated that both modems 10 and 30 are capable of transmitting and receiving data in the illustrated implementation, wherein the modems 10 and 30 may both be configured to monitor noise with respect to data received thereby and to selectively propose and to institute an interleaver depth change in a cooperative manner with the other modem.

In the exemplary system 2, the first modem 10 is adapted to monitor impulse noise (e.g., corrected and uncorrected packetized errors, etc.) with respect to data received on the communication channel 4 from the second modem 30 during communication service. The first modem 10 analyzes the monitored impulse noise and selectively proposes appropriate noise protection parameter changes to the second modem 30. The modems 10 and 30 are adapted to cooperatively adjust impulse noise protection for transferring data from the modem 30 to the modem 10 (e.g., by selectively adjusting the codeword format including the number of FEC redundancy bytes and/or the codeword size, and/or by selectively adjusting the amount of interleaving) according to the observed impulse noise without interrupting the communication service. In accordance with another aspect of the invention, moreover, the exemplary first modem 10 may be further adapted to monitor continuous noise with respect to data received from the second modem 30 (e.g., SNR, non-packetized errors, etc.) on the communication channel 4 during the communication service, wherein the modems 10 and 30 are further adapted to cooperatively adjust continuous noise protection in the system according to the continuous noise in a coordinated fashion to minimize redundancy without communication service interruption.

The exemplary first modem 10 comprises a transceiver 18 that is coupleable to the channel 4 and operates to support communication (e.g., DSL) service with the second modem 30. With respect to received data from the second modem 30, the transceiver 18 operates to receive such data from the channel 4. The first modem 10 also comprises an application interface 12 to a host system, such as a service subscriber's home computer (not shown), wherein the second modem 30 also comprises an application interface 32 with a network node (not shown). The FEC system 14 of the first modem 10 comprises an FEC decoder and a de-interleaver operating in conjunction with an FEC controller 16, wherein the forward error correction (FEC) system 34 of the second modem 30 includes an FEC encoder and an interleaver with a corresponding FEC controller 36, where the FEC system 34 provides redundancy bytes to outgoing data when transmitting to the first modem 10. The FEC system 14 of the receiving first modem 10, in turn, uses the received redundancy bytes to correct errors in incoming data (when receiving data from the second modem 30). In a bidirectional setting, the FEC system 14 of the first modem 10 further provides selective interleaving and encoding of outgoing data (when transmitting data to the second modem 30) and the FEC system 34 of the second modem 30 provides de-interleaving of incoming data (when receiving data from the second modem 30), wherein the exemplary FEC systems 14 and 34 each comprises suitable logic circuits for controlling the FEC/IL functions described herein, as well as memory for buffering data to be interleaved/de-interleaved.

The transceiver 18 of the first modem 10 provides demodulation of incoming data from the second modem 30, and includes suitable analog circuits for interfacing with the communication channel 4 for receipt of incoming data. In the second modem 30, the transceiver 38 provides for tone ordering or bit distribution, wherein outgoing data bits to be transmitted over each subcarrier are encoded as signal points in signal constellations using bit distribution parameters provided by a bit distribution controller 40. The transceiver 38 of the second modem 30 also modulates the outgoing subcarrier constellations (in the presented example using inverse discrete Fourier transform (IDFT)) and provides the modulated signals to the channel 4 according to subcarrier gain scale settings from the controller 40. For incoming data received from the second modem 30, the transceiver 18 of the first modem 10 demodulates the received signals into individual subcarrier constellations (e.g., by discrete Fourier transform or DFT techniques in the presented example), and decodes the received constellations according to the parameters from a corresponding bit distribution controller 20.

The first modem 10 also includes a local management system 22 that provides the FEC/IL parameters to the FEC controller 16 for the number of redundancy bytes in the received data and the amount or level of de-interleaving thereof (e.g., interleaver depth data D), and also provides the bit distribution settings or parameters to the controller 20, including subcarrier bit allocations, gain settings, etc. for decoding and demodulation of the incoming data received from the channel 4. The FEC system 14 then performs de-interleaving and error correction according to parameters from the FEC controller 16, and provides the resulting incoming data to the application interface 12.

The second modem 30 implements similar functionality with respect to normal DSL communication service, and comprises a transceiver 38 coupled with the channel 4, a bit distribution system 40 that controls the modulation (demodulation) and encoding (decoding) of data in the transceiver 38. The second modem 30 further comprises an application interface 32 for interfacing to a host system (not shown), as well as an FEC system 34 and a corresponding FEC controller 36 for providing data interleaving and forward error correction functions similar to those described above with respect to the first modem 10. The second modem 30 also includes a local management system 42, providing control parameters and settings to the FEC controller 36 and to the bit distribution controller 40.

The local management systems 22 and 42 of the first and second modems 10 and 30, respectively, exchange control information and messages with one another via a local management channel 46, such as one of the subcarriers of the communication channel 4 using any suitable communication or data exchange protocol, so as to coordinate parameters settings, rate adjustments, timing of changes, etc. In particular, the local management systems 22 and 42 exchange bit distribution and gain settings for use by the respective bit distribution controllers 20 and 40, as well as FEC/IL and codeword size settings for use by the respective FEC controllers 16 and 36. In the illustrated system 2, the local management systems 22 and 42 exchange settings and information via the management channel 46 during system initialization for establishing initial subcarrier bit capacities and gain settings based on initial measurements of the subcarrier continuous noise levels (e.g., SNR). For instance, during initialization, the signal-to-noise ratio (SNR) for each subcarrier is obtained, and the maximum bit capacity of each subcarrier is determined by one of the modems 10, 30. This information is sent to the other modem, such that upon initiating DSL service, the modems are using the same parameters. Likewise, FEC/IL parameters and codeword size are initially set by one of the modems, according to initial impulse noise measurements or according to some other criteria (e.g., minimum protection or maximum delay), with the settings being replicated to the other modem via the management channel 46.

In accordance with the present invention, the exemplary first modem 10 also comprises a noise and error monitor system 24 and an analyzer 26, wherein the monitor system 24 monitors data transfer errors occurring on the communication channel 4 for incoming data received from the second modem 30 via error information from the FEC system 14 during DSL service, and the analyzer 26 determines whether the incoming data transfer errors indicate the presence of impulse noise on the channel 4. In particular, the analyzer 26 determines whether any of the incoming data transfer errors are packetized errors (e.g., relatively large errors of short duration), and whether such packetized errors are corrected or uncorrected by the FEC system 14. Either or both of the analyzer 26 and the monitor system 24, and/or any of the other components of the first modem 10 illustrated in FIG. 1 may be fabricated together with the transceiver 18 as a single integrated circuit. It is noted that the exemplary second modem 30 also comprises noise monitoring and analyzing components (not shown) for monitoring and analyzing noise and data transfer errors for data transferred from the first modem 10 to the second modem 30, wherein the various impulse noise protection adjustment features of the invention are provided for data being transferred in both directions along the channel 4 in the exemplary system 2.

Figure 2:
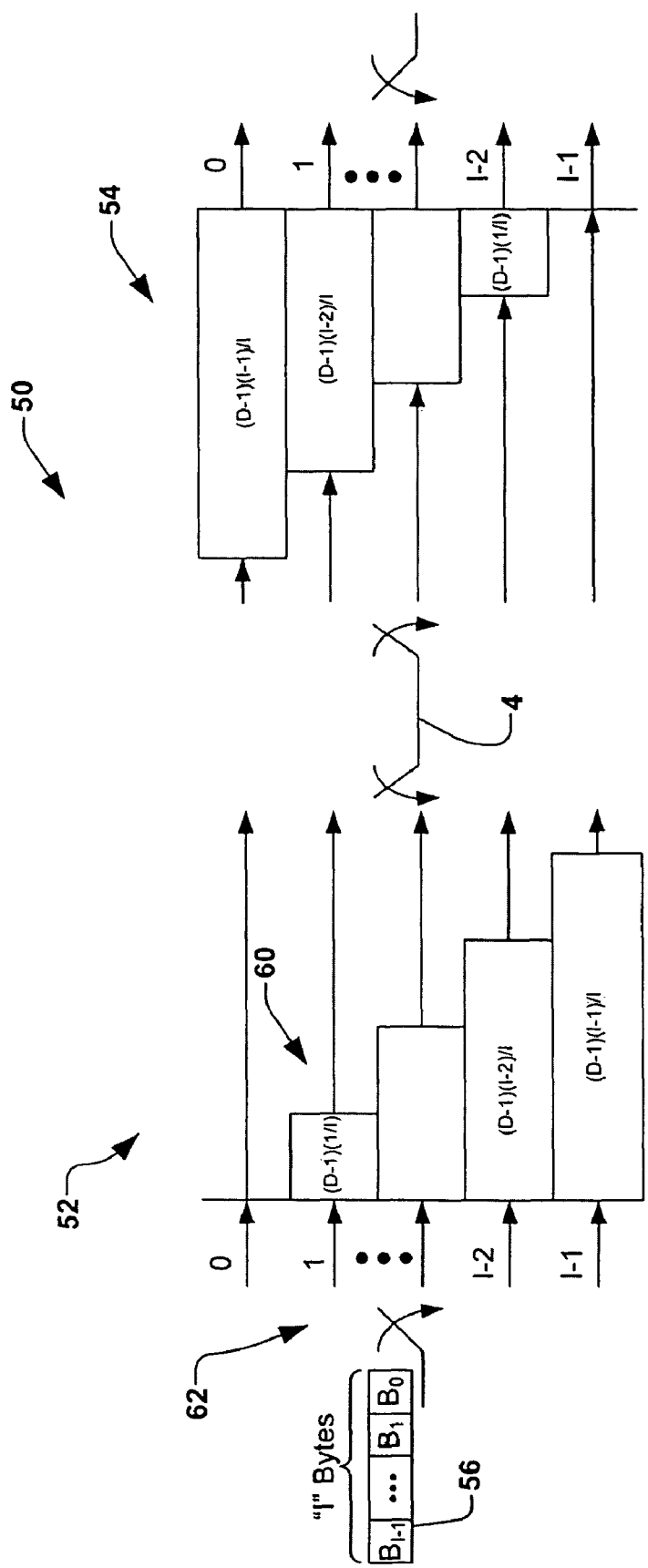
FIG. 2 is a schematic diagram illustrating a convolutional interleaver and operating characteristics associated therewith.

In order to fully appreciate various aspects of the invention, a brief discussion of some elements and operation of a convolutional encoder are provided below in conjunction with FIG. 2. As illustrated in FIG. 2, a convolutional interleaver system 50 has a transmitter side 52 and a receiver side 54, respectively, wherein an incoming data block 56 (e.g., a codeword) is interleaved with other data blocks on the transmitter side 52 and subsequently de-interleaved on the reception side 54, respectively, wherein the original data blocks are recovered. In FIG. 2 an incoming data block or codeword 56 constitutes a block of l bytes (e.g., $B_0, B_1, \ldots B_{l-1}$). Each byte in the data block is selectively switched to a different "row" of the interleaver, wherein the number of rows corresponds to the number of bytes in each block (e.g., "l" rows corresponding to "l" bytes per block). Each byte from a data block that is input to a row is then delayed according to its position within the block by the interleaver depth according to the formula:

$$\text{Delay} = j \times (D-1); j=0, 1, 2, \ldots (l-1),$$

wherein j is the index of the byte position within each data block, and D is the interleaver depth. In accordance with the present invention, a data block may be identical to a codeword or alternatively may comprise a fraction of a codeword.

In the receiver or the reception side 54, the procedure is inverted and the bytes are delayed according to their byte position in the interleaved block (and thus according to the row to which the byte is delivered), wherein the delay for the de-interleaver is:

$$\text{Delay} = (l-1-j) \times (D-1); j=0, 1, 2, \ldots (l-1).$$

Consequently, each byte is delayed by a combination of the interleaver and the de-interleaver by $(l-1) \times (D-1)$ bytes. As can be seen from the above, the interleaver depth D is a key parameter of the interleaver and represents the number of bytes in the outgoing interleaved data stream between two neighboring data bytes within the same data block (e.g., the byte distance in the interleaved data stream between $B_0$ and $B_1$ of the same data block). Therefore as the interleaver depth D is increased, the communication system exhibits a greater capability to withstand impulse noise, however, an increase in D also increases the system latency in accordance with the above formula and requires additional memory. Consequently, it can be seen that as impulse noise conditions change or the data rate changes, it may be desirable to alter the interleaver depth (increase or decrease) to optimize the system performance (e.g., adequate protection against individual byte errors, achieve required error protection length, and maximization of data rate).

As illustrated in FIG. 2, the transmitter interleaver 52 comprises a plurality of varying length queues or delay elements 60, such as FIFOs, that receive multiple, serial input data blocks (e.g., serial input block 56) and, using a switching or control circuit 62 (e.g., the FEC controller 36 of FIG. 1), writes sequentially the data bytes therein to the various FIFOs 60, wherein a first FIFO ($FIFO_0$) has no delay, and a last or $l^{th}$ FIFO ($FIFO_{l-1}$), has a maximum delay associated therewith.

As discussed above, each byte, by adding the delays highlighted above, is delayed by a combination of the interleaver 52 and the de-interleaver 54 by $(l-1) \times (D-1)$ bytes, and thus each transceiver is required to maintain (per transmission direction) a memory the size of $[(l-1) \times (D-1)]/2$. As discussed above, and shown in FIG. 2, such memory employed to hold the data bytes can be implemented using the delay paths illustrated as FIFO buffers. The average length of each FIFO buffer corresponds to the respective delay in bytes divided by the block size "l". Consequently, the average length of a FIFO for the "$l^{th}$" byte in a block is $(D-1) \times (l-1)/l$.

In accordance with one aspect of the present invention, a change in the interleaver depth (and the amount of change ΔD) may be requested by the receiver based on a change in system conditions, for example, an increase in impulse noise.

For example, referring to FIG. 1, the subscriber modem 10 may inform the provider modem 30 via the management channel 46. The transceiver 38 of the provider system 30 then provides a synchronization signal to the transceiver 18 to indicate when a change in the interleaving depth is to occur. In one example, the synchronization communication is performed over the loop 4 since such signaling experiences the same propagation delay as subsequent data, however, in another example the management channel 46 may be employed. In response to the interleaver depth adjustment request, the FEC controller 36 and the FEC module 34 (containing the interleaver therein) cooperatively operate to increase the transmission FIFOs in the interleaver by an amount based on the size of the requested depth change $\Delta D$. In accordance with one aspect of the present invention, the transmission FIFOs are increased in size by changing a location of a read pointer associated with each FIFO.

In a typical random access memory (in conjunction with an ALU containing registers), a FIFO is implemented logically by a write pointer and a read pointer, wherein the write pointer is an address that points to a location in the memory where incoming data (a byte from a data block) is to be written, while a read pointer is an address pointing to a location in the memory where data is to be retrieved for transmission. By altering the address of the read pointer, the size of the FIFO is altered. In accordance with the present invention, as will be discussed in greater detail infra, a $\Delta D$ increase results in each of the transmitting FIFOs 60 being increased by differing amounts associated with $\Delta D$. For example, $FIFO_1$ is increased on average by $\Delta D/l$, $FIFO_2$ is increased on average by $2 \times \Delta D/l$, ... and $FIFO_{l-1}$ is increased on average by $(l-1) \times \Delta D/l$.

Alternatively, counters (not shown) (e.g., in the FEC controller 36 of FIG. 1) associated with each of the transmitting FIFOs 60 in the interleaver will have a unique count associated therewith in which, until that count is reached, dummy bytes are transmitted instead of retrieving data bytes from the FIFOs 60.

Figure 3:
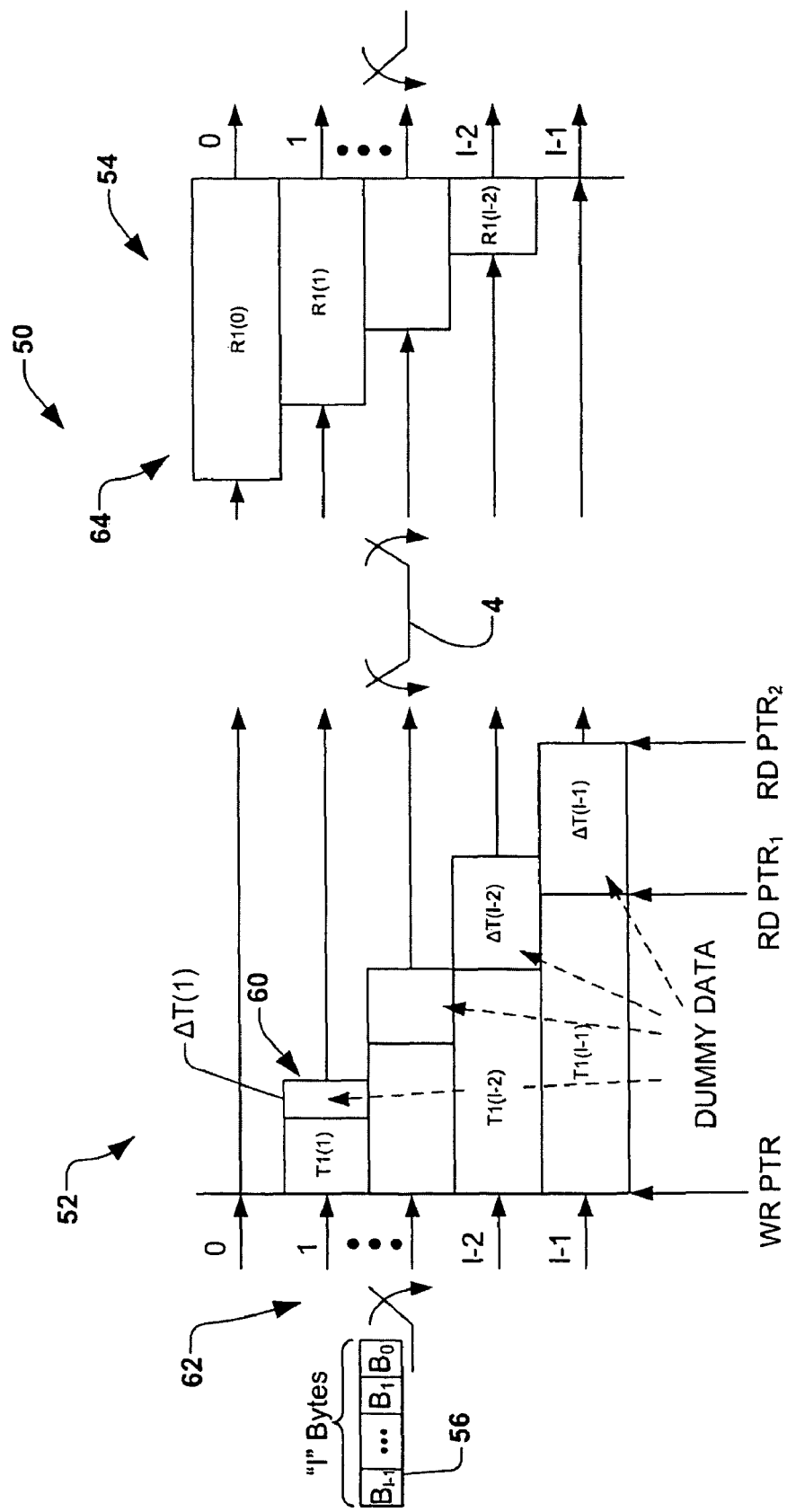
FIG. 3 is a schematic diagram illustrating a convolutional interleaver prior to a change implemented in the interleaver length.

Turning now to FIG. 3, a simplified convolutional interleaver 50 is illustrated, wherein the transmitter FIFOs 60 have been increased based on a positive $\Delta D$ request. Note that since $FIFO_0$ is a virtual FIFO with no delay, no delay is added thereto, while the other FIFOs 60 have increased in size. The change in size can be appreciated as follows. For this explanation we define the moment indicated by the variable "y". Since the lengths of the transmission FIFOs 60 periodically change during each cycle of the reading and writing of "l" bytes, the moment "y" represents the moment a transmission FIFO#y shall be read next at the switch 72 (e.g., that may comprise a multiplexer). Therefore "y" represents the integer number of the transmission FIFO 60 that is going to be read, wherein $0 \leq y \leq (l-1)$.

If $T_1(z,y)$, for $z=0, 1, \ldots (l-1)$, represents the size of each transmit FIFO prior to the size change at FIFO#y, and $T_2(z,y)$ represents the new FIFO size, then $T_2(z,y)$ is equal to $T_1(z,y)+\Delta T(z,y)$, wherein $\Delta T(z,y)$ represents the increase in size of the transmitter FIFOs based on the increased interleaver depth $\Delta D$. Note that the variable "z" is employed instead of "j" that represented the actual byte location in each block discussed in conjunction with FIG. 2 because in accordance with the present invention (as will be discussed in greater detail infra) the writing to and reading from each transmitter FIFO 60 does not typically occur at the same time, and so $T(z,y)$ is a function of time and will dither $+/-1$ byte in accordance therewith. Consequently, $T_2(z,y)$ represents the FIFO length after the change in depth. The average increase in each FIFO is a function of where in each block those bytes reside, and will equal $\Delta D \times z/l$. Thus, each FIFO 60 will be increased by a differing amount.

One example of the increased FIFO size is illustrated in FIG. 3 with a $FIFO_{l-1}$ being adjusted in size by moving the read pointer ($RD\ PTR_1$) to a new location ($RD\ PTR_2$) based on $\Delta T(z,y)=T_2(z,y)-T_1(z,y)$. Note that when such a change is initially made, the data in the added portion of each FIFO contains dummy data as marked in FIG. 3. Consequently, when the transmission of data occurs based on the new transmitter FIFO sizes, a period of time will exist where the receiver side 54 will throw away or discard the dummy bytes and not write that dummy data to the receiver FIFOs in the de-interleaver. For example, since the receiver modem 10 communicates the desired $\Delta D$ to the transmitting modem 30, it knows what the resultant $\Delta T(z,y)$ will be for each of the transmitting FIFOs (and thus knows how much dummy data will exist in each of the transmitting FIFOs 60). Accordingly, counters (not shown) (e.g., in the FEC controller 16 of FIG. 1) associated with each of the receiving FIFOs 64 in the de-interleaver will have a unique count associated therewith in which, until that count is reached, the incoming data bytes, which are the dummy bytes, will be discarded for that row and not input into the receiving FIFOs 64. Since $\Delta T(z,y)$ is different for each of the receiving FIFOs (because each transmitting FIFO is increased by a different amount and thus has a different number of dummy bytes), the count of each receiving FIFO counter at which data will no longer be discarded will be different. Once the count of each counter is reached, the next data bytes incoming to that receiving FIFO will be received and placed therein (at the location dictated by the write pointer associated with that particular FIFO).

Note that with respect to the "$l^{th}$" transmission FIFO, it has the largest amount of dummy data ($\Delta T(l-1)$), however, on the receiver side (the de-interleaver), no FIFO exists because such data is passed on through the de-interleaver without any delay. At such time instances data transmission at the output of the de-interleaver 50 has to be stopped since the dummy data bytes may not be transferred on the line 69 (see, e.g., FIG. 4).

Figure 4:
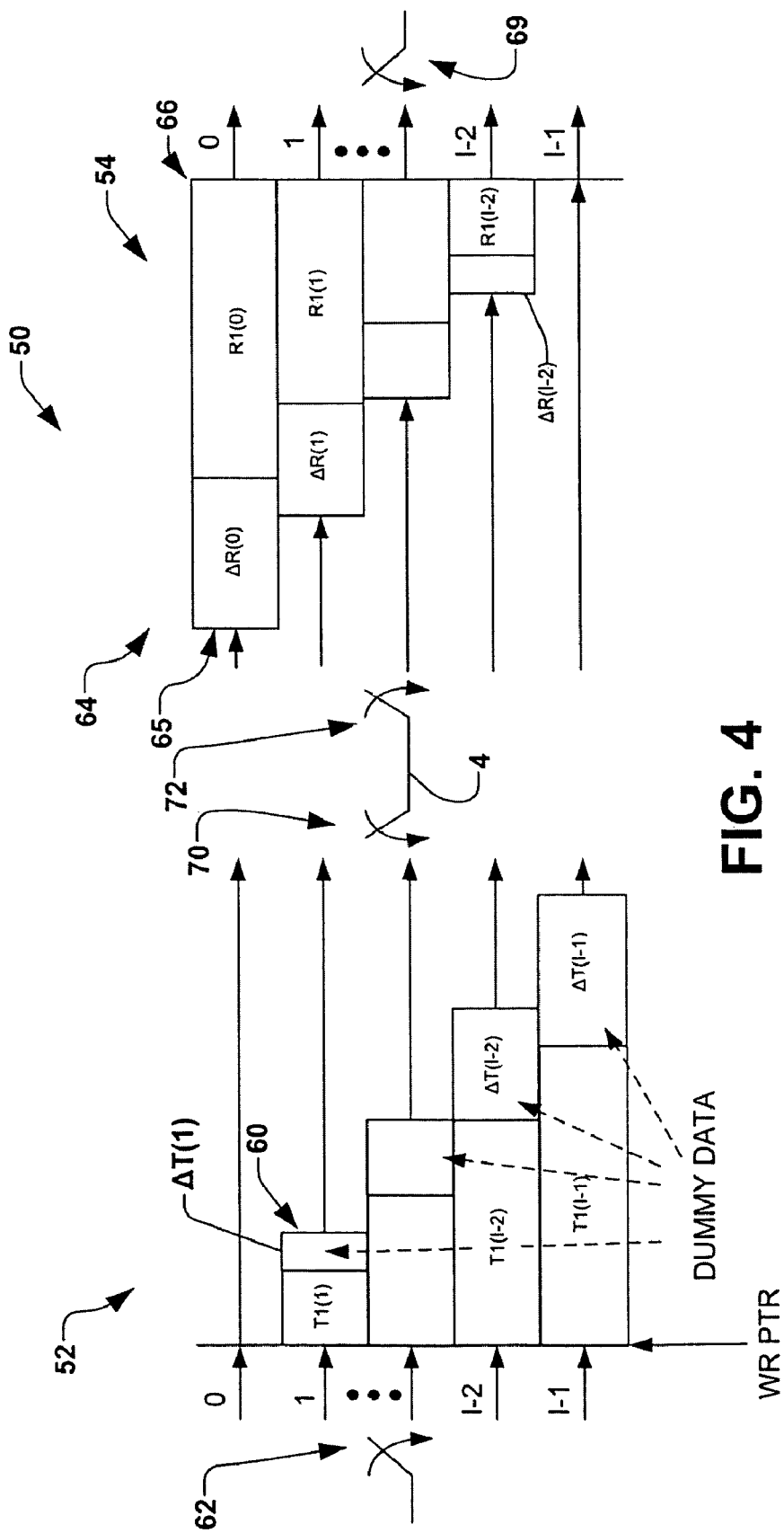
FIG. 4 is a schematic diagram illustrating a convolutional interleaver undergoing an interleaver depth increase at the transmitter end according to an aspect of the present invention.

Referring now to FIG. 4, in addition to what is occurring on the receiving or input side 65 of the receiving FIFOs 64 in the de-interleaver, the other end 66 (the output side) of the de-interleaver (where the reconstructed, non-interleaved data is forwarded on), is de-activated for a time associated with $\Delta D \times l$ bytes (that is, until there is finally valid data arriving from the transmitting $l-1$ FIFO location). Consequently, latency is added into the system, however, that latency corresponds to the increased interleaver depth $\Delta D$, as would be expected. During that time where the transmission portion of the receiving FIFOs 64 is inoperative (e.g., the switch 69), data is still received at the inputs 65 by the transmission FIFOs, causing each of the receiving FIFOs 64 to be increased in size an amount $\Delta R(z,y)$ corresponding to $\Delta D$.

One exemplary manner of calculating the number of dummy bytes for each transmission FIFO 60 is to use the second variable "y" that references a moment in the system operation.

Therefore $T(z,y)$ comprises a reference length of transmission FIFO#z shortly before the output of FIFO#y will be read (e.g., when the multiplexer between the interleaver 52 and the loop 4 points to the FIFO at issue). The reference lengths may not be the real lengths of each FIFO since the analysis does not account for the pace of writing to the transmission FIFOs, however, such offset does not affect the calculation of $\Delta T(z,y)$.

If $T_j(y)$ represents an average length of the FIFO#y, then $$T_j(y)=(D_j-1)*y/l,$$

which may not be an integer value. Consequently, $$T_j(y,y)=\text{floor}[(D_j-1)*y/l],$$

which represents Tj(y), rounded down to the next lowest integer value, and $$\text{Toff}_j(y)=T_j(y)-T_j(y,y),$$

which represents the rounded off value that was "dropped" with the "floor" operator. Therefore:

$$\text{Toff}_j(y)=[(D_j-1)*y/l-\text{floor}((D_j-1)*y/l)].$$

Therefore the offset value, $\text{Toff}_j(y)$ can be calculated and subtracted from the average length of each transmission FIFO (and then rounding down, or dropping the remainder), as follows:

$$T_j(z,y)=\text{floor}[(D_j-1)*z/l-\text{Toff}_j(y)].$$

By calculating $T_j(z,y)$ at the present interleaver depth $D_1$ and the new interleaver depth $D_2$, the change in each transmission FIFO size (representing the needed number of dummy bytes) is calculated as follows:

$$\Delta T_{raw}(z,y)=T_2(z,y)-T_1(z,y)=\text{floor}[(D_2-1)*z/l-\text{Toff}_2(y)]-\text{floor}[(D_1-1)*z/l-\text{Toff}_1(y)].$$

The above formula for $\Delta T_{raw}(z,y)$ properly characterizes the number of dummy bytes needed per FIFO for an increase in the interleaver depth. To more generally characterize the equations for both an increase and a decrease in the interleaver depth, we determine:

$$\Delta T\min(y)=\min(\Delta T_{raw}(z,y)),$$

wherein $\Delta T\min(y)$ is the minimum value from $\Delta T_{raw}(z,y)$ with z=(0, 1, . . . l–1). With that, $$\Delta T(z,y)=\Delta T_{raw}(z,y)-\Delta T\min(y).$$

If D1<D2 (an increase in interleaver depth) then $\Delta T\min(y)$ is zero and the equation simplifies to $\Delta T(z,y)=\Delta T_{raw}(z,y)$ as expected. If, however, If D1>D2 (meaning that the interleaver depth will decrease), then $\Delta T\min(y)$ is a negative number that when subtracted above increases $\Delta T_{raw}(z,y)$ to all positive or at least zero values.

As can be seen, the change in each FIFO size will be a function of the change in interleaver depth ($\Delta D$) and will vary for each of the transmission FIFOs based on its value "z". Therefore the number of dummy bytes to be inserted into each transmission FIFO can be calculated for a given change in interleaver depth.

In the above manner the interleaver and de-interleaver can be modified with respect to its depth an amount $\Delta D$, wherein the amount $\Delta D$ can be any amount and need not be an integer multiple of the data block size "l". Consequently, the present invention provides for a fine granularity adjustment in the interleaver depth, which allows the system greater flexibility optimizing the system when environmental changes occur.

The present invention advantageously improves the granularity of allowable changes in the interleaver depth by altering an ordering in which data is read from the transmitting FIFOs and transferred to the receiving FIFOs. For example, the ordering in which data in the data blocks 56 are input into the transmitting FIFOs 60 is fixed. That is, the first byte ($B_0$) always is input to $row_0$, the second byte ($B_1$) to $row_1$, and so on, and such ordering is independent of the interleaver depth D. The order in which the data is read from the transmitting FIFOs, however, does not follow such an ordering according to the present invention, but instead follows an ordering that is a function of the interleaver depth (e.g., initially an ordering associated with the interleaver depth $D_1$ prior to a change). For example, if l=10, and thus there are ten rows, the first row in which data may be read (e.g., via switch 70 in FIG. 4) may be row 2, and the next may be row 5, then row 8, then row 1 (with a wrap-around), etc. Note that the switch (or control circuit) 72 operates synchronously with the switch (or control circuit) 70 such that data read from a row "n" from the transmitting FIFOs 60 will be written to the same row "n" in the receiving FIFOs 64.

Then, when a change in the interleaver depth occurs (e.g., from $D_1$ to $D_2$), the transmitter FIFOs sizes are changed as discussed, and also the ordering in which data is read from the transmitting FIFOs 60 is changed from the earlier ordering, wherein the new ordering is a function of the new interleaver depth $D_2$. The altering in the ordering discussed above is performed by a controller circuit, for example, within the FEC controllers 16, 36 in accordance with a control algorithm. On example of such a control algorithm is disclosed in U.S. Pat. No. 5,764,649, which is hereby incorporated by reference in its entirety. By dynamically changing the ordering in which the data is read from the transmitting FIFOs to the receiving FIFOs based on the interleaver depth, altering the sizes of the FIFOs, and selectively discarding the dummy bytes associated therewith, the present invention can alter the interleaver depth with any degree of granularity, wherein the prior art was limited to depth changes of D=M×l+1 (that is, integer multiples of the block size l).

According to another aspect of the present invention, the interleaver depth can be decreased by an amount $\Delta D$ in a somewhat similar manner. As described above, initially the receiver identifies a system condition, for example, a change in the impulse noise conditions that justify a decrease in the interleaver depth. The receiver then communicates the desired change to the transmitter via, for example, the management channel 46, and the transmitter then sends a synchronization signal (preferably via a data channel) to the receiver modem 10 to indicate when the change in interleaver depth is to occur.

Figure 5:
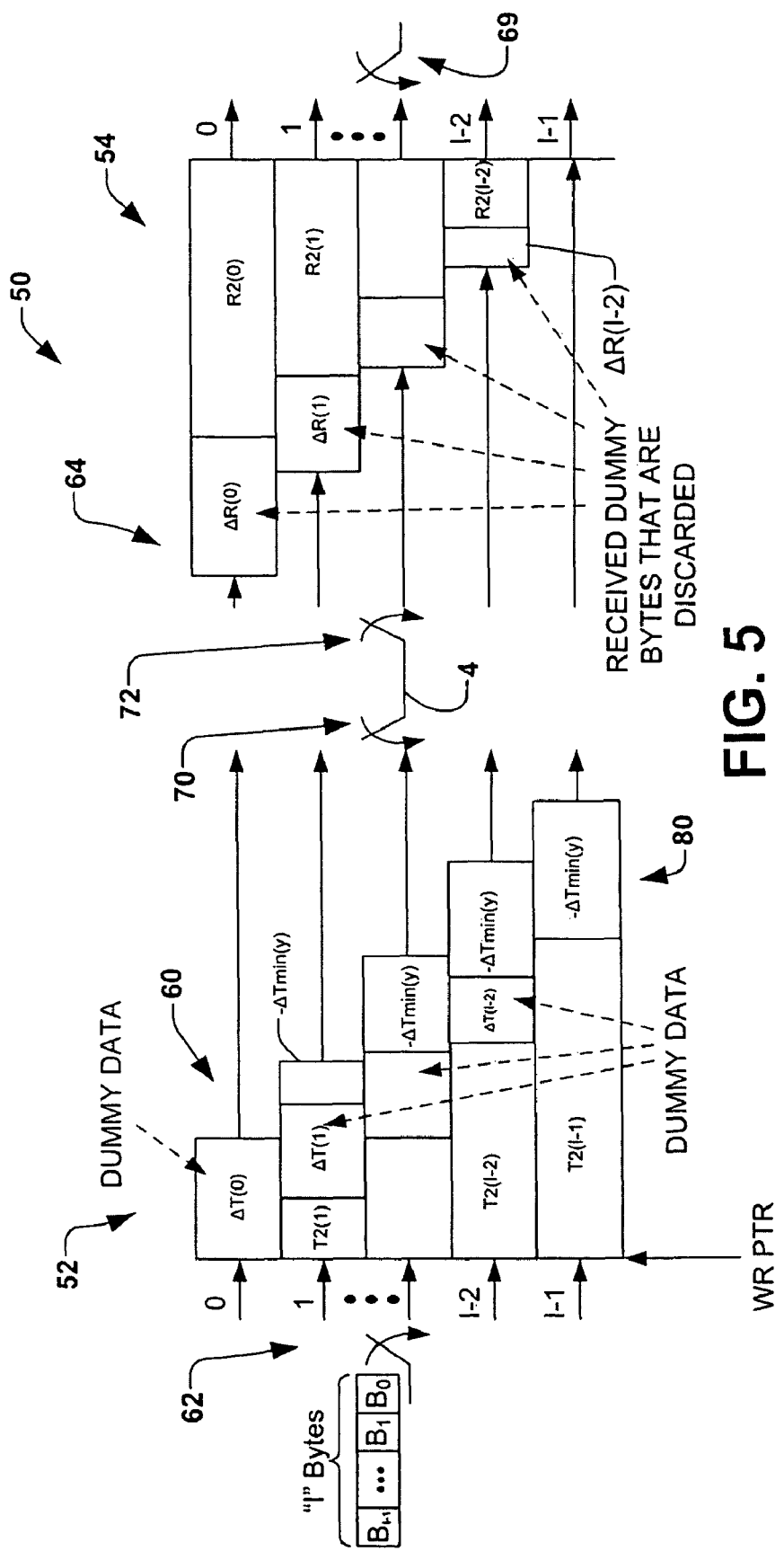
FIG. 5 is a schematic diagram illustrating a convolutional interleaver undergoing an interleaver depth decrease at both the transmitter and receiver according to another aspect of the present invention.

The procedure starts by changing the order in which data from the transmitting FIFO in the interleaver is read from the transmitting FIFOs 60 and written into the receiving FIFOs 64 in the de-interleaver, wherein the order change (e.g., of the switches 70 and 72) is a function of the change in interleaver depth $D_2$. As discussed supra, an ordering control algorithm such as that discussed in U.S. Pat. No. 5,764,649 may be employed. Concurrently, since there is an amount of valid data corresponding to $\Delta D$ in the l–1 transmission FIFO, and that data must still be transmitted to properly recapture the data at the receiver, the other FIFOs are altered (for example, by adjusting read pointers) to contain some dummy data, as illustrated in FIG. 5. That is, each of the transmission FIFOs 60 are altered (via their read pointers) to meet the length $T_2(z,y)=T_1(z,y)-\Delta T(z,y)+\Delta T\min(y)$, as illustrated. In the above manner, as incoming data to the transmission FIFOs 60 is stopped (no switching at 62), data continues to be read from the transmission FIFOs 60 in an ordering based on a control circuit at switch 70 and transferred to the receiving FIFOs 64 via switch 72 based on the updated transfer ordering of the switches (e.g., as controlled by the FEC controllers 16, 36). That way the valid data $\Delta D$ in the transmission $\text{FIFO}_{l-1}$ is transferred and received while the smaller amounts of valid data ($\Delta D$ in each of the transmit FIFOs) are also transferred. The dummy bytes in each of the transmit FIFOs are also transferred, but are discarded by the receiver and thus not stored (e.g., by not incrementing pointer(s) associated therewith) in the receiving FIFOs 64. Since data is transferring over the loop 4 while new data is not incoming to the transmission FIFOs 60 (switch 62 is off), each of the transmission FIFOs are decreased by an amount ΔD, thus corresponding to the desired decrease in the interleaver depth. This procedure lasts for a time period corresponding to ΔD×l bytes, at which time the data incoming to the transmission FIFOs is re-initiated and the receiver stops selectively discarding bytes and receives and stores all incoming data.

In the above embodiment of the invention, a change in the interleaver depth (ΔD) is performed with flexibility in the granularity of the amount of change. In such a solution, however, dummy data bytes are introduced and transferred in a block format, wherein an interruption in the data stream at the output of the receiver (the output of the de-interleaver) occurs for a period of time equal to about ΔD*(l−1) bytes. In accordance with another embodiment of the present invention, a system and method of varying the interleaver depth is provided, wherein dummy bytes introduced to facilitate the change in depth are spread out or distributed within the useful data, thereby facilitating a substantially continuous transfer of data, and avoiding substantial data transfer interruptions.

As will be further appreciated in the discussion below, the present invention evaluates a distance (in time) between a byte about to be transferred (at the output of the relevant transmission FIFO 60) and the byte that preceded that byte at the input of the interleaver (the preceding byte in the original interleaver data block 56). If the distance is less than a predetermined value, then the distance in time is too small to maintain the distance, and a dummy byte is selectively transmitted instead of the data byte (the transmission of the useful data byte is postponed and not substituted) in order to keep the bytes sufficiently separated to meet a distance associated with a given impulse noise protection (INP) level. Alternatively, when the distance in time between the bytes is greater than the threshold, then the data byte will be transmitted. In the above fashion, the change in interleaver depth (ΔD) has little impact on the data transmission. Such an improvement is substantially advantageous in systems or applications that do not allow for a variation in latency.

In accordance with the present invention, the impulse noise protection (INP) requirement is met at all times during the change in interleaver depth by requiring that the distance in time to the previous byte of the same interleaver block is maintained. Since the distance in bytes between successive bytes in an interleaver block is $D_1$ (the present interleaver depth), and if $L_1$ represents the transmission byte rate, then the distance in time between the successive bytes is $TD_1 = D_1/L_1$. The system and method of the present invention maintains $TD_1$ to be greater than TDmin, which represents the minimum distance in time between bytes that will achieve the required INP. To maintain the INP, a change in the interleaver depth to $D_2$ requires that $TD_2 = D_2/L_2$ (wherein $L_2$ is the byte transmission rate after the change in interleaver depth) also be greater than TDmin. Therefore:

$$TDmin < D_1/L_1, \text{ and } TDmin < D_2/L_2.$$

The system and method of the present invention thus calculates the distance $TD_2$ between bytes based on the new interleaver depth ($D_2$), and if the distance is greater than TDmin (or another acceptable threshold, for example, a value greater than TDmin), then the data byte is transmitted because no dummy byte is required to maintain the required distance in time between the bytes to achieve the desired INP at the new depth. Conversely, if the distance in time $TD_2$ is less than TDmin, then a dummy byte is transmitted instead of the data byte about to be transferred, so that at all time instants the INP is maintained. By evaluating as highlighted above, the dummy bytes are distributed throughout the useful data as opposed to be input as dummy data blocks, thereby permitting the data transmission to remain substantially continuous.

Figure 6:
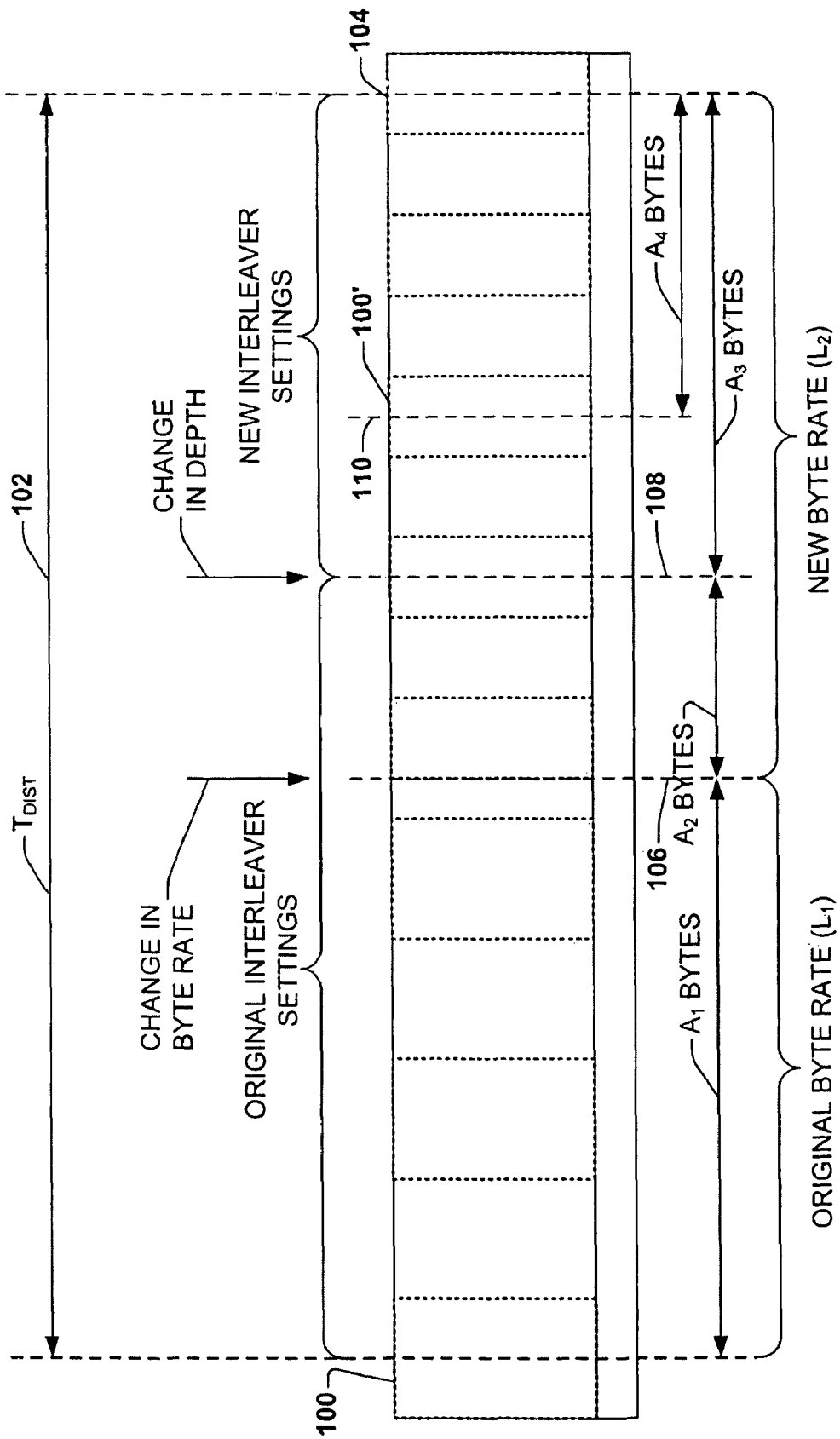
FIG. 6 is a block diagram illustrating a distance between bytes associated with an interleaver data block due to interleaving, a change in interleaver depth, and a change in byte transmission rate.

FIG. 6 illustrates a manner in which the distance in time between bytes may be determined in accordance with the present invention. In FIG. 6 a preceding byte 100 is a distance in time 102 ($T_{DIST}$) from a byte 104 about to be transmitted over the loop 4. In the present example, a change in byte transmission rate from $L_1$ to $L_2$ occurs at a time 106, and a change in interleaver depth occurs at a later time 108. When such conditions occur, the change in byte transmission rate must be taken into account to determine the distance in time 102 between the bytes 100 and 104.

If $A_1$ represents the number of bytes transmitted at transmission rate $L_1$ between the preceding byte 100 and the change in byte transmission rate 106, $A_2$ represents the number of bytes between the change in transmission rate 106 and the change in interleaver depth 108 (at rate $L_2$), and $A_3$ represents the number of bytes from the change in interleaver depth 108 to the byte 104 about to be transmitted (at rate $L_2$), the total distance in time 102 between the bytes 100 and 104 is:

$$T_{DIST} = A_1/L_1 + (A_2 + A_3)/L_2.$$

Note that under conditions where the change in byte transmission rate 106 and the change in interleaver depth 108 occur at the same time, $A_2 = 0$. Also, note that in conditions where the change in interleaver depth 108 occurs before the change in byte transmission rate 106, the equation changes as follows:

$$T_{DIST} = (A_1 + A_2)/L_1 + A_3/L_2.$$

Lastly, in the situation where the byte transmission rate has not changed since the preceding byte, then the preceding byte 100' occurs at a time 110, wherein the distance in time 102 is calculated as:

$$T_{DIST} = A_4/L_2.$$

In the above manner, the distance in time ($T_{DIST}$) between the two bytes 100 and 104 can be determined.

Figure 7A:
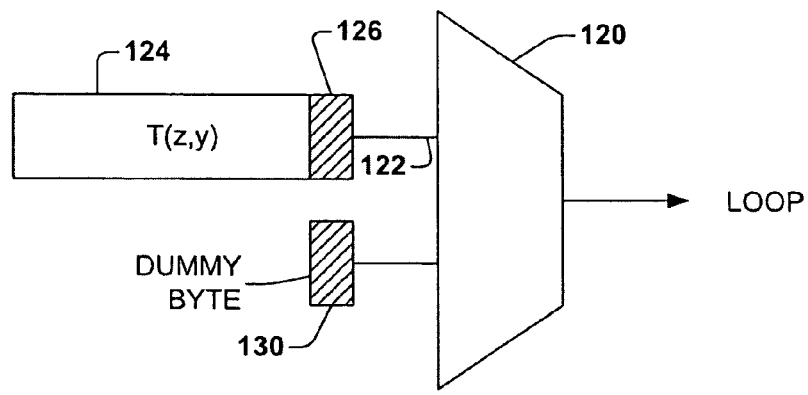
FIG. 7A is a combined block and schematic diagram illustrating the selective transmission of either a data byte or a dummy byte based upon an established criteria in accordance with an embodiment of the present invention.
Figure 7B:
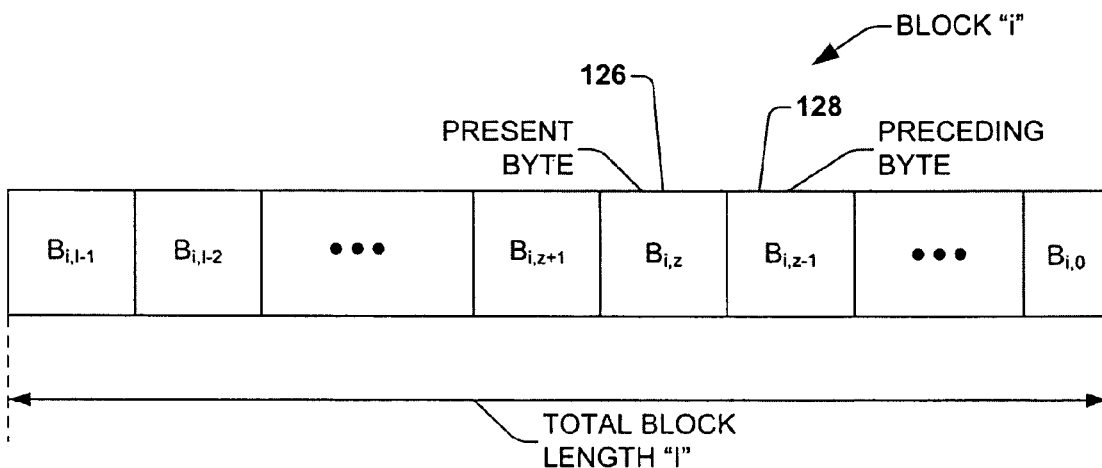
FIG. 7B is a block diagram illustrating neighboring bytes in an interleaver data block in accordance with an example of the present invention.

The present invention contemplates a control circuit for determining a distance in time between the bytes 100 and 104 of FIG. 6, and selectively transmitting either the data byte at issue or a dummy byte in response to a comparison of the determined distance and a predetermined threshold. For example, as illustrated in FIGS. 7A and 7B, a combined control circuit and multiplexer circuit 120 is located between the outputs of the transmission FIFOs 60 and the loop 4 of FIG. 5 (e.g., replacing the switch 70).

The multiplexer 120 receives at one input 122 an output of one of the transmission FIFOs 124, for example, T(z,y), wherein z is an integer between 0 and l−1 (wherein l is an integer representing the interleaver block size). As illustrated in FIG. 7A, the transmission FIFO 124 is labeled T(z,y) to indicate that the FIFO at issue is the one at moment "y", that is about to transmit its data byte 126 over the loop 4. The multiplexer 120 or control circuit associated therewith, at that moment, performs a distance in time calculation ($T_{DIST}$) between that byte 126 ($B_{i,z}$) (e.g., the byte associated with FIFO#z of block "i") and its preceding byte 128 ($B_{i,z−1}$) (e.g., the byte that preceded byte 126 in the original interleaver block that has already been transmitted). FIG. 7B illustrates the relationship between the bytes 126 and 128 in a codeword or data block prior to being input to the interleaver, and FIG. 6 illustrates the bytes (illustrated as bytes 100 and 104) after interleaving, wherein they are separated by a distance in time ($T_{DIST}$).

The control circuit and interleaver 120 performs the distance in time calculation and compares the distance to a predetermined threshold, for example, TDmin, and based on the comparison transmits either the byte 126 or a dummy byte 130. More particularly, if the distance $T_{DIST}$ is greater than TDmin, then sufficient distance exists between the bytes 126 and 128 to satisfy the INP, and thus the byte 126 is transmitted. Alternatively, if $T_{DIST}$ is less than TDmin, then insufficient distance would exist between the bytes 126 and 128, and thus a dummy byte 130 is transmitted to increase the distance $T_{DIST}$ between the bytes 126 and 128.

Note that in the above discussion, a control circuit and multiplexer is described between the output of the transmission FIFOs and the loop. In addition, the system and method of the present invention includes a control circuit between the loop and the receiving FIFOs of the de-interleaver (e.g., at the location of the switch 72 in FIG. 5), wherein the receiver control circuit operates synchronously with the transmission control circuit. Similarly, the receiver control circuit uses the same control evaluation, for example, to identify when a dummy byte is being transmitted, and upon receipt thereof, the control circuit, instead of inserting the dummy byte into the receiver FIFO, discards the byte and moves to the next receiver FIFO.

Figure 8:
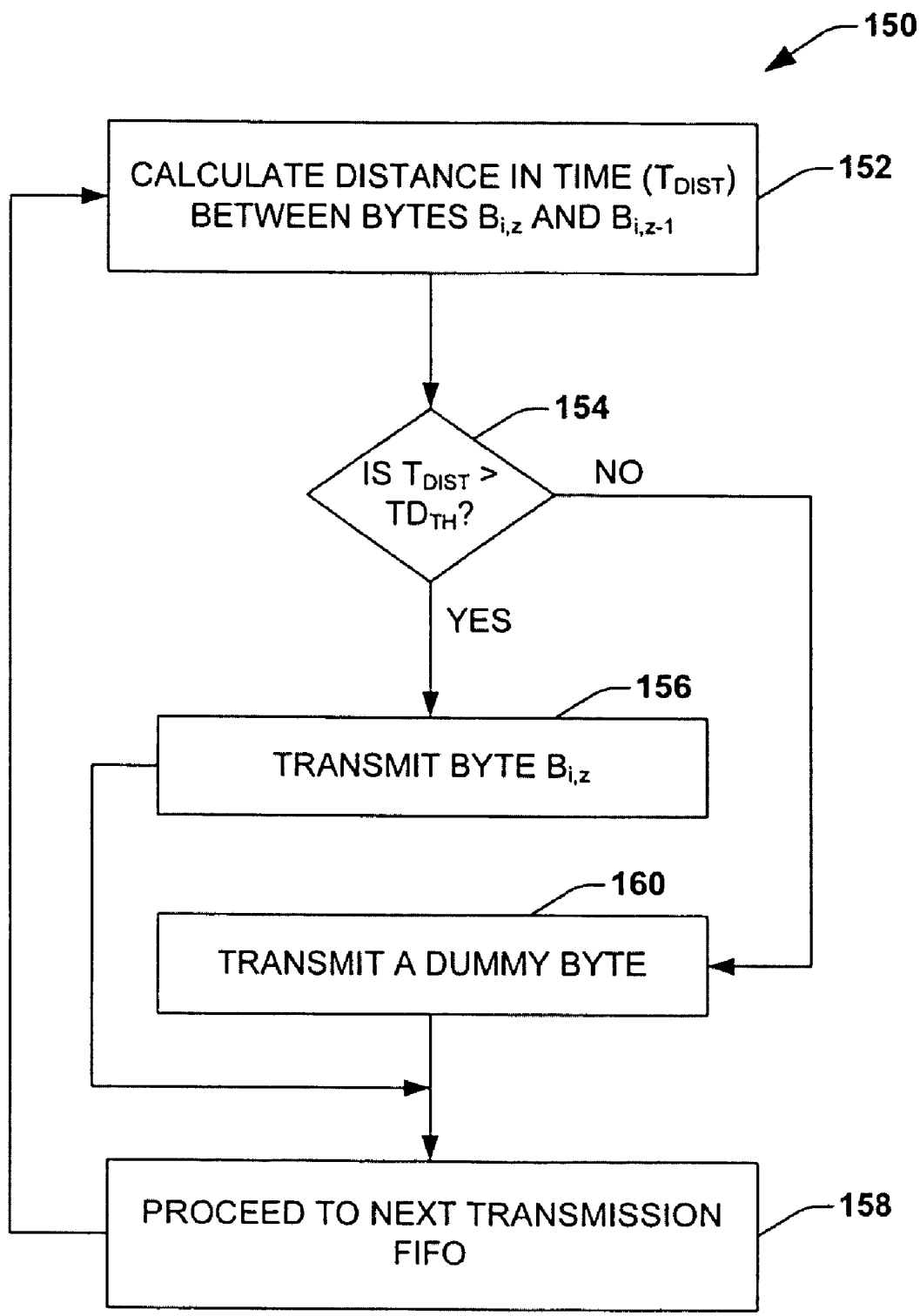
FIG. 8 is a flow chart diagram illustrating a method of selectively inserting dummy bytes spread throughout useful data in order to accommodate a change in interleaver depth according to one embodiment of the present invention.

Turning now to FIG. 8, a method 150 of selectively transmitting dummy bytes spread throughout the useful data is disclosed in accordance with one exemplary embodiment of the present invention. While the method 150 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with any type or form of communication system, including but not limited to DSL systems.

The method 150 begins at 152, wherein a distance in time $T_{DIST}$ is calculated between a byte about to be transmitted and its preceding byte in the original interleaver block. For example, as highlighted above and illustrated in FIG. 6, the distance may be calculated based upon whether a change in interleaver depth and/or byte transmission rate has changed and the ordering thereof to ascertain the distance $T_{DIST}$. The distance is then compared to a predetermined threshold $TD_{TH}$ at 154. If the distance is greater than the threshold (YES at 154), then sufficient distance already exists between the bytes and no dummy bytes are needed. Thus the method 150 progresses to 156, wherein the byte to be transmitted ($B_{i,z}$) is transmitted over the loop 4. If the result of the analysis at 154 is negative (NO at 154), then insufficient distance in time exists between the present byte and its preceding byte ($B_{i,z-1}$), and a dummy byte is transmitted instead of the byte ($B_{i,z}$) at 160. In either case, upon transmission of the byte ($B_{i,z}$) or the dummy byte, the method 150 continues to 158, wherein the multiplexer 120 proceeds to the next transmission FIFO to be accessed according to the order highlighted earlier herein (which is a function of the present interleaver depth). The method 150 then continues with the next byte to be transferred. Note, there is one exception to the procedure above. Bytes from transmission FIFO #0 are read and transmitted without the check as described above. The reason is that those bytes ($B_{i,0}$) are the first in an interleaver block and do not have a preceding byte in this block. In the above manner, dummy bytes are only transmitted when needed to maintain a desired INP, and such dummy bytes, instead of being transferred as a block and causing an interruption in data transmission at the output of the de-interleaver, spreads the dummy bytes throughout the useful data on as as-needed basis, thereby preserving a latency of the system.

In another example, to ease the implementation, the rule described above may be modified by transmitting occasionally dummy bytes earlier than required by the basic rule above. For example it may be advantageous to transmit a small block of dummy bytes for each FIFO (except #0) immediately after the change of D. The number of dummy bytes shall be such that no multiplication (or division) with the value $A_1$ is needed for calculating the distance to the preceding byte. The number of bytes to be transmitted upfront is, for this example:

$$\text{floor}[(\Delta D^* z/l - T\text{off}_2(y) + T\text{off}_1(y)] - \text{floor}[(\Delta D^*(z-1)/l - T\text{off}_2(y) + T\text{off}_1(y)]$$

After the transmission of the small block of dummy bytes the remaining dummy bytes are transmitted according to the basic rules described earlier.

Another, more general, method to spread the dummy bytes is to perform the above comparison of the distance to the preceding byte for all FIFOs whenever a byte shall be sent. A dummy byte is sent when no output byte of any of the transmitter FIFOs including FIFO #0 fulfills the distance requirement. If one FIFO fulfills the requirement this byte is sent. If more than one byte fulfills the requirement that byte shall be sent that exceeds the threshold most. If more than one byte has the same highest distance we would take the one from the FIFO with the smallest number z. New to the rule is that now also first bytes of an interleaver block have to fulfill a distance requirement. In this example, first bytes of an interleaver block at the output of FIFO#0 have now to maintain a distance in time to the first byte of the preceding interleaver block. The threshold that has to be achieved for the distance of first bytes of subsequent blocks is the block length l.

In accordance with another aspect of the invention, dummy bytes may be spread throughout the useful data in conjunction with a decrease in the interleaver depth. When the interleaver depth is to decrease, the depth changes from $D_1$ to $D_2$, wherein $D_2 < D_1$. In order to ascertain the order of dummy bytes to effectuate the change in depth in one example, a simulated change from $D_2$ to $D_1$ (and $L_2$ to $L_1$) is performed (a hypothetical increase in depth) and a determination is made regarding the pattern of transmitted dummy bytes. This pattern is then employed to decrease the interleaver depth by reversing or inverting the order of the pattern. Consequently, dummy bytes are then selectively inserted (and discarded at the receiver FIFOs) according to the predetermined inverse pattern. In the above manner, then, it can be appreciated that the system and method of increasing the depth may be employed to decrease the depth by reversing the time flow. Since the above example also reverses the flow of data, we can exchange the transmitter and receiver, input and output, insertion of dummy bytes and the discarding thereof. The above methodology may also be employed by sending dummy bytes in blocks as discussed supra as opposed to spreading the dummy bytes throughout the useful data.

Although the example embodiment highlighted above discloses one particular method by which a pattern of dummy bytes is spread throughout the useful data, it should be appreciated that other mechanisms may be employed in which dummy bytes are spread throughout the useful data in order to accommodate a change in interleaver depth while maintaining the INP throughout the change. Therefore any manner of generating such a pattern of dummy bytes throughout the useful data may be employed and is contemplated as falling within the scope of the present invention.

In addition, in the above examples, the predetermined threshold employed in the comparison of act 154 is associated with the INP requirement (TDmin). Alternatively, other threshold values may be employed and such variations in the predetermined threshold is contemplated by the present invention.

In accordance with another aspect of the invention, assigning a predefined value to the dummy bytes is contemplated by the present invention, and may be used to facilitate in synchronization, error detection and estimation, as may be appreciated.

In addition, while the example provided herein has been described for a change of interleaver depth and transmission rate for a single channel, the present invention may be employed to perform a seamless transfer of data rate from one channel to another if both channels share the same transmission media. In general, both channels have a different interleaving. The channel that reduces the byte transmission rate will reduce the interleaver depth, and this process will finish before the rate change is performed. The channel that takes over the new byte transmission rate will increase its depth D so that the process of altering the depth is after the change in byte transmission rates. Therefore in one exemplary aspect of the invention, a transfer of byte transmission rates between two channels may be performed with one unit that controls the insertion of dummy bytes.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A device comprising a convolution interleaver configured to interleave a plurality of codewords or data blocks based on an interleaver depth,
   wherein the convolutional interleaver is configured to change the interleaver depth by an amount other than an integer multiple of the block length of the plurality of codewords or data blocks;
   wherein the convolution interleaver is configured to insert dummy bytes in an output sequence of the convolution interleaver when changing the interleaver depth;
   wherein the convolution interleaver is configured to increase the interleaver depth from a first interleaver depth D1 to a second interleaver depth D2, and wherein a number of dummy bytes inserted in the output sequence is determined by the sum obtained by summing up $\Delta T(z,y)$ for $z=0$ to $l-1$, wherein z is a variable representing the "$Z^{th}$" byte in the data block or codeword, and wherein $$\Delta T(z,y)=\text{floor}[(D_2-1)*z/l - T\text{off}_2(y)]-\text{flool}[(D_1-1)*z/l-T\text{off}_1(y)] \text{ wherein}$$

$$T\text{off}_j(y)=[(D_j-1)*y/l-\text{floor}((D_j-1)*y/l)],$$

wherein $D_j$ represents the interleaver depth either before the change in interleaver depth, wherein $D_j$ is $D_1$, or after the change in interleaver depth, wherein $D_j$ is $D_2$, and wherein floor(m) is a mathematical operator wherein the value "m" is rounded down to the next lowest integer value, and l comprises the number of bytes associated with a data block or codeword to be transmitted, wherein the convolution interleaver comprises a plurality of transmission FIFOs, and wherein y represents an integer value of a transmission FIFO#y that is going to be read, wherein $0 \leq y \leq l-1$.

2. A device comprising a convolution interleaver configured to interleave a plurality of codewords or data blocks based on an interleaver depth,
   wherein the convolutional interleaver is configured to change the interleaver depth by an amount other than an integer multiple of the block length of the plurality of codewords or data blocks;
   wherein the convolution interleaver is configured to insert dummy bytes in an output sequence of the convolution interleaver when changing the interleaver depth;
   wherein the convolution interleaver is configured to increase the interleaver depth from a first interleaver depth D1 to a second interleaver depth D2, and wherein the convolution interleaver is further configured to change the interleaver depth such that a byte at the first position of the codeword or data block is read after the change, wherein the number of dummy bytes inserted in the output sequence is determined by the sum obtained by summing up the value $\Delta T(z)$ for all $z=0$ to $l-1$, wherein $$\Delta T(z)=\text{floor}[(D_2-1)*z/l]-\text{floor}[(D_1-1)*z/l], \text{ and}$$

wherein floor(m) is a mathematical operator wherein the value "m" is rounded down to the next lowest integer value, and wherein l comprises the number of bytes associated with a data block or codeword.

3. A device comprising a convolution interleaver configured to interleave a plurality of codewords or data blocks based on an interleaver depth,
   wherein the convolutional interleaver is configured to change the interleaver depth by an amount other than an integer multiple of the block length of the plurality of codewords or data blocks;
   wherein the convolution interleaver is configured to insert dummy bytes in an output sequence of the convolution interleaver when changing the interleaver depth;
   wherein the convolution interleaver is configured to decrease the interleaver depth from a first interleaver depth D1 to a second interleaver depth D2, and configured to insert dummy bytes with a first byte pattern of dummy bytes, wherein the first byte pattern of dummy bytes corresponds to an inverted second byte pattern of dummy bytes, and wherein the second byte pattern of dummy bytes is a byte pattern of dummy bytes the convolution interleaver would insert during an increase of the interleaver depth from the second interleaver depth D2 to the first interleaver depth D1.

4. A convolution interleaver within a transmitter comprising:
- an input configured to receive a plurality of codewords or data blocks;
- a convolution interleaver circuit configured to interleave the received plurality of codewords or data blocks based on an interleaver depth, wherein the convolution interleaver circuit is configured to change the interleaver depth from a first interleaver depth D1 to a second interleaver depth D2 such that, after the change in interleaver depth, a byte at the first position of a codeword or data block is read from the convolution interleaver circuit, and wherein the convolution interleaver circuit is configured to insert an amount of dummy bytes in an output sequence of the convolution interleaver circuit, wherein an amount of dummy bytes is determined by the sum obtained by summing up the value $\Delta T(z)$ for $z=0$ to $l-1$, wherein z is a variable representing the "$z^{th}$" byte in the codeword or data block, wherein $\Delta T(z)=\text{floor}[(D_2-1)*z/l]-\text{floor}[(D_1-1)*z/l]$, and wherein l comprises the number of bytes associated with the data block or codeword.

5. The convolution interleaver according to claim 4, wherein the convolution interleaver is implemented on a semiconductor chip.

6. The convolution interleaver according to claim 4, wherein the transmitter containing the convolution interleaver comprises a digital subscriber line modem.

7. A convolution interleaver within a transmitter comprising:
- an input configured to receive a plurality of codewords or data blocks;
- a convolution interleaver circuit configured to interleave the plurality of received codewords or data blocks, wherein the convolution interleaver circuit is configured to decrease the interleaver depth from a first interleaver depth D1 to a second interleaver depth D2, and configured to insert dummy bytes with a first pattern in an output sequence of the convolution interleaver circuit, wherein the first pattern corresponds to an inverted second pattern, wherein the second pattern is a pattern of inserted dummy bytes the convolution interleaver would insert during an increase of the interleaver depth from the second interleaver depth D2 to the first interleaver depth D1.

8. The convolution interleaver according to claim 6, wherein the convolution interleaver is implemented on a semiconductor chip.

9. The convolution interleaver according to claim 8, wherein the transmitter comprises a digital subscriber line transmission system.

10. A method comprising:
- convolutional interleaving a plurality of codewords or data blocks based on an interleaver depth to form an output sequence of processed data;
- decreasing the interleaver depth such that the plurality of codewords or data blocks are, prior to the decrease of the interleaver depth, convolution interleaved with a first interleaver depth D1 and are, after the decrease of the interleaver depth, convolution interleaved with a second interleaver depth D2, wherein D2<D1;
- selectively inserting dummy bytes with a first insertion pattern into the output sequence based on the second interleaver depth D2, wherein the first insertion pattern corresponds to an inverted second insertion pattern, wherein the second insertion pattern is an insertion pattern of dummy bytes the convolution interleaver would insert during an increase of the interleaver depth from second interleaver depth D2 to the first interleaver depth D1.

* * * * *